(12) United States Patent
Kuroda

(10) Patent No.: US 7,779,277 B2
(45) Date of Patent: Aug. 17, 2010

(54) POWER CONTROL FOR A PLURALITY OF INTERNAL POWER SUPPLY CIRCUITS OF A SEMICONDUCTOR INTEGRATED CIRCUIT

(75) Inventor: Naoki Kuroda, Kyoto (JP)

(73) Assignee: Panasonic Corporation, Osaka (JP)

( * ) Notice: Subject to any disclaimer, the term of this patent is extended or adjusted under 35 U.S.C. 154(b) by 742 days.

(21) Appl. No.: 11/730,683

(22) Filed: Apr. 3, 2007

(65) Prior Publication Data
US 2007/0253125 A1 Nov. 1, 2007

(30) Foreign Application Priority Data
Apr. 27, 2006 (JP) .............................. 2006-123768
Feb. 9, 2007 (JP) .............................. 2007-030917

(51) Int. Cl.
*G06F 1/00* (2006.01)
*G11C 29/00* (2006.01)
*H02J 1/00* (2006.01)

(52) U.S. Cl. ...................... 713/300; 713/324; 714/718; 323/318

(58) Field of Classification Search ................. 713/300, 713/324; 714/718; 323/318
See application file for complete search history.

(56) References Cited

U.S. PATENT DOCUMENTS

| | | | |
|---|---|---|---|
| 6,118,323 A | | 9/2000 | Chaine et al. |
| 6,339,357 B1 * | | 1/2002 | Yamasaki et al. ........... 327/538 |
| 6,549,480 B2 * | | 4/2003 | Hosogane et al. ........... 365/226 |
| 6,639,454 B2 * | | 10/2003 | Hoshi et al. ................. 327/544 |
| 7,170,811 B1 * | | 1/2007 | Allen .......................... 365/226 |
| 7,200,054 B2 * | | 4/2007 | Horiguchi et al. ...... 365/189.11 |
| 7,342,837 B2 * | | 3/2008 | Park ...................... 365/189.09 |
| 2003/0021162 A1 | | 1/2003 | Morishita et al. |
| 2004/0109368 A1 * | | 6/2004 | Kuroda ....................... 365/200 |

FOREIGN PATENT DOCUMENTS

| CN | 1505050 A | 6/2004 |
|---|---|---|
| JP | 2004-186435 | 7/2004 |
| JP | 2005-259267 | 9/2005 |

OTHER PUBLICATIONS

Chinese Office Action, w/ English translation thereof, issued in Chinese Patent Application No. CN 200710102672.3 dated Mar. 9, 2010.

* cited by examiner

*Primary Examiner*—Ji H Bae
(74) *Attorney, Agent, or Firm*—McDermott Will & Emery LLP

(57) ABSTRACT

A semiconductor integrated circuit including on a single chip a plurality of circuit blocks and a plurality of internal power supply circuits for delivering a common supply voltage to the plurality of circuit blocks includes: a shared power supply interconnection for connecting the plurality of circuit blocks and the plurality of internal power supply circuits; and an external pad connected to the shared power supply interconnection. Whether or not each of the internal power supply circuits delivers the supply voltage is controlled by a certain power supply control signal.

20 Claims, 7 Drawing Sheets

POWER CONTROL FOR A PLURALITY OF INTERNAL POWER SUPPLY CIRCUITS OF A SEMICONDUCTOR INTEGRATED CIRCUIT

CROSS-REFERENCE TO RELATED APPLICATION

This non-provisional application claims priority under 35 U.S.C. §119(a) of Japanese Patent Applications Nos. 2006-123768 and 2007-030917 filed in Japan on Apr. 27, 2006 and Feb. 9, 2007, respectively, the entire contents of which are hereby incorporated by reference.

BACKGROUND OF THE INVENTION

1. Field of the Invention

The present invention relates to a semiconductor integrated circuit equipped with dynamic random access memories or the like for use in various appliances such as digital appliances.

2. Description of Related Art

A system LSI (large scale integrated circuit) is often used for digital appliances which have been experiencing fierce price competition. Accordingly, there is an increasing demand for reduction in chip cost and the number of pads used. However, in recent years, semiconductor devices have been fabricated at a finer pitch and the number of pads required for a semiconductor integrated circuit such as a system LSI is increasing due to increased scale of a logic circuit and the combination of analog circuits and memory circuits on a single chip.

Above all, the number of pads required for memory inspection is increasing because the capacity and the number of memories included in the system LSI are increasing with the improvement in function and performance of the digital appliances. Therefore, it is urgently required to reduce the number of the pads used for the memory inspection, such as pads for monitoring internal supply voltages delivered from internal power supply circuits to dynamic random access memories.

With respect to a semiconductor integrated circuit including a plurality of internal power supply circuits for delivering a power supply voltage to memories, Japanese Unexamined Patent Publication No. 2004-186435 discloses a technique of switching the conduction between the internal power supply circuits and a monitoring pad with use of a switch.

Further, according to Japanese Unexamined Patent Publication No. 2005-259267, an internal power supply voltage output by a single internal power supply circuit is shared among a plurality of memories to reduce the chip area.

In the semiconductor integrated circuit including a plurality of internal power supply circuits as described above, however the pads used for monitoring the power supply voltage or applying an external voltage are required for every internal voltage generator circuit, or alternatively, a switch is required as disclosed by Japanese Unexamined Patent Publication No. 2004-186435.

SUMMARY OF THE INVENTION

The present invention has been achieved in view of the above disadvantages of the conventional techniques. An object of the present invention is to reduce the number of pads of a semiconductor integrated circuit including a plurality of internal power supply circuits.

To achieve the object, a semiconductor integrated circuit according to a first aspect of the present invention includes on a single chip a plurality of circuit blocks and a plurality of internal power supply circuits for delivering a common supply voltage to the plurality of circuit blocks, the semiconductor integrated circuit including: a shared power supply interconnection for connecting the plurality of circuit blocks and the plurality of internal power supply circuits; and an external pad connected to the shared power supply interconnection, wherein whether or not each of the internal power supply circuits delivers the supply voltage is controlled by a certain power supply control signal.

With the configuration according to the first aspect, the supply voltage delivered from the plurality of internal power supply circuits to the plurality of circuit blocks is monitored through a single external pad connected to the shared supply voltage interconnection.

According to a second aspect of the invention, in the semiconductor integrated circuit according to the first aspect, the control by the power supply control signal is performed when at least one of the plurality of circuit blocks is in a test mode.

With the configuration according to the second aspect, control is made as to whether or not the internal power supply circuits deliver the supply voltage in the test mode.

According to a third aspect of the invention, the semiconductor integrated circuit of the second aspect further includes: a plurality of AND circuits provided to correspond to the circuit blocks, each of which outputs a logical product of a circuit block test control signal which is switched to the H level to place the corresponding circuit block in the test mode and a supply voltage stop instruction signal which is switched to the H level to stop the delivery of the supply voltage; and an OR circuit which outputs a logical sum of the logical products delivered by the AND circuits as the power supply control signal.

According to a fourth aspect of the invention, the semiconductor integrated circuit of the second aspect further includes: an OR circuit which outputs a logical sum of a plurality of circuit block test control signals which are switched to the H level to place the circuit blocks in the test mode; and an AND circuit which outputs a logical product of the logical sum and a supply voltage stop instruction signal which is switched to the H level to stop the delivery of the supply voltage as the power supply control signal.

With the configuration according to the third and fourth aspects, whether or not the internal power supply circuits deliver the supply voltage is easily controlled by the circuit block test control signals and the supply voltage stop instruction signal.

According to a fifth aspect of the invention, in the semiconductor integrated circuit of the first aspect, the outputs of the internal power supply circuits are in a high impedance state when the internal power supply circuits do not deliver the supply voltage.

With the configuration according to the fifth aspect, the voltage is easily applied from the external pad to the shared power supply interconnection.

According to a sixth aspect of the invention, in the semiconductor integrated circuit of the first aspect, the circuit blocks are memories, a logic circuit block is provided on the same chip in addition to the memories and the common supply voltage delivered from the internal power supply circuits to the memories is not lower than a voltage supplied to the logic circuit block.

According to a seventh aspect of the invention, a semiconductor integrated circuit includes on a single chip a plurality of circuit blocks and a plurality of internal power supply circuits for delivering a common supply voltage to the plurality of circuit blocks, the semiconductor integrated circuit including: a shared power supply interconnection for connecting the plurality of circuit blocks and the plurality of internal power supply circuits; an external pad connected to the shared power supply interconnection; and a plurality of mode registers provided to correspond to the circuit blocks and the internal power supply circuits and store mode set control signals, respectively, wherein each of the plurality of mode registers updates the stored mode set control signal to a value corresponding to a common test input signal when a macro selection input signal indicating to select the corresponding circuit block or the corresponding internal power supply circuit is input and each of the circuit blocks and internal power supply circuits is operated in a mode corresponding to the mode set control signal stored in the corresponding mode register.

With the configuration according to the seventh aspect, the internal power supply circuit selected by the macro selection input signal is operated in a mode corresponding to the mode set control signal updated to the value corresponding to the test input signal. Since one or more of the internal power supply circuits are selected by the macro selection input signal, it is possible to place the one or more of the internal power supply circuits in a mode of delivering the supply voltage and the other internal power supply circuits in a mode of not delivering the supply voltage. Therefore, the circuit suitable for inspection of the internal power supply circuits is easily designed and the inspection and evaluation are easily performed.

According to an eighth aspect of the invention, in the semiconductor integrated circuit according to the seventh aspect, one or more of the plurality of internal power supply circuits and circuit blocks are selected by the macro selection input signal during the test mode.

With the configuration according to the eighth aspect, one or more of the internal power supply circuits and circuit blocks, which are operated at a value corresponding to the common test input signal, are selected by the macro selection input signal.

According to a ninth aspect of the invention, in the semiconductor integrated circuit of the eighth aspect, voltage trimming is performed on the level of the supply voltage delivered from each of the plurality of internal power supply circuits.

With the configuration according to the ninth aspect, it becomes possible to trim the level of the supply voltage delivered from each of the internal power supply circuits.

According to a tenth aspect of the invention, a semiconductor integrated circuit includes on a single chip a plurality of circuit blocks and a plurality of internal power supply circuits for delivering a common supply voltage to the plurality of circuit blocks, the semiconductor integrated circuit including: a shared power supply interconnection for connecting the plurality of circuit blocks and the plurality of internal power supply circuits; an external pad connected to the shared power supply interconnection; a plurality of mode registers for the circuit blocks provided to correspond to the plurality of circuit blocks and store mode set control signals, respectively; and a mode register for the internal power supply circuits shared among the plurality of internal power supply circuits and stores a mode set control signal, wherein each of the plurality of mode registers for the circuit blocks updates the stored mode set control signal to a value corresponding to a common test input signal when a macro selection input signal indicating to select the corresponding circuit block is input, each of the plurality of circuit blocks is operated in a mode corresponding to the mode set control signal stored in the corresponding mode register for the circuit block and each of the plurality of internal power supply circuits is operated in a mode corresponding to the mode set control signal stored in the mode register for the internal power supply circuits when a macro selection input signal indicating to select the internal power supply circuit is input.

With the configuration according to the tenth aspect, the internal power supply circuit selected by the macro selection input signal is operated in a mode corresponding to the mode set control signal stored in the mode register for the internal power supply circuits. Since one or more of the internal power supply circuits are selected by the macro selection input signal, it is possible to place the one or more of the internal power supply circuits in a mode of delivering the supply voltage and the other internal power supply circuits in a mode of not delivering the supply voltage. Therefore, the circuit suitable for inspection of the internal power supply circuits is easily designed and the inspection and evaluation are easily performed.

According to an eleventh aspect of the invention, a semiconductor integrated circuit includes on a single chip a plurality of circuit blocks and a plurality of internal power supply circuits for delivering a common supply voltage to the plurality of circuit blocks, the semiconductor integrated circuit including: a shared power supply interconnection for connecting the plurality of circuit blocks and the plurality of internal power supply circuits; an external pad connected to the shared power supply interconnection; and a plurality of mode registers provided to correspond to the internal power supply circuits, each of which stores a mode set control signal and a selection signal which indicates whether or not to select the corresponding internal power supply circuit, wherein each of the plurality of internal power supply circuits is operated in a mode corresponding to the mode set control signal stored in the corresponding mode register when the selection signal stored in the corresponding mode register indicates to select the internal power supply circuit.

With the configuration according to the eleventh aspect, the internal power supply circuit selected by the selection signal is operated in a mode corresponding to the mode set control signal stored in the corresponding mode register. Since one or more of the internal power supply circuits are selected by the selection signal, it is possible to place the one or more of the internal power supply circuits in a mode of delivering the supply voltage and the other internal power supply circuits in a mode of not delivering the supply voltage. Therefore, the circuit suitable for inspection of the internal power supply circuits is easily designed and the inspection and evaluation are easily performed.

According to a twelfth aspect of the invention, in the semiconductor integrated circuit of the eleventh aspect, each of the plurality of mode registers stores, in addition to the selection signal indicating whether or not to select the corresponding internal power supply circuit, a selection signal indicating whether or not to select the other internal power supply circuits than the internal power supply circuit corresponding to the mode register.

With the configuration according to the twelfth aspect, each of the mode registers stores the selection signal corresponding to the plurality of internal power supply circuits. Therefore, the plurality of mode registers are configured with the same structure and the man-hour required for designing the mode registers is easily reduced.

DETAILED DESCRIPTION OF THE INVENTION

Figure 1:
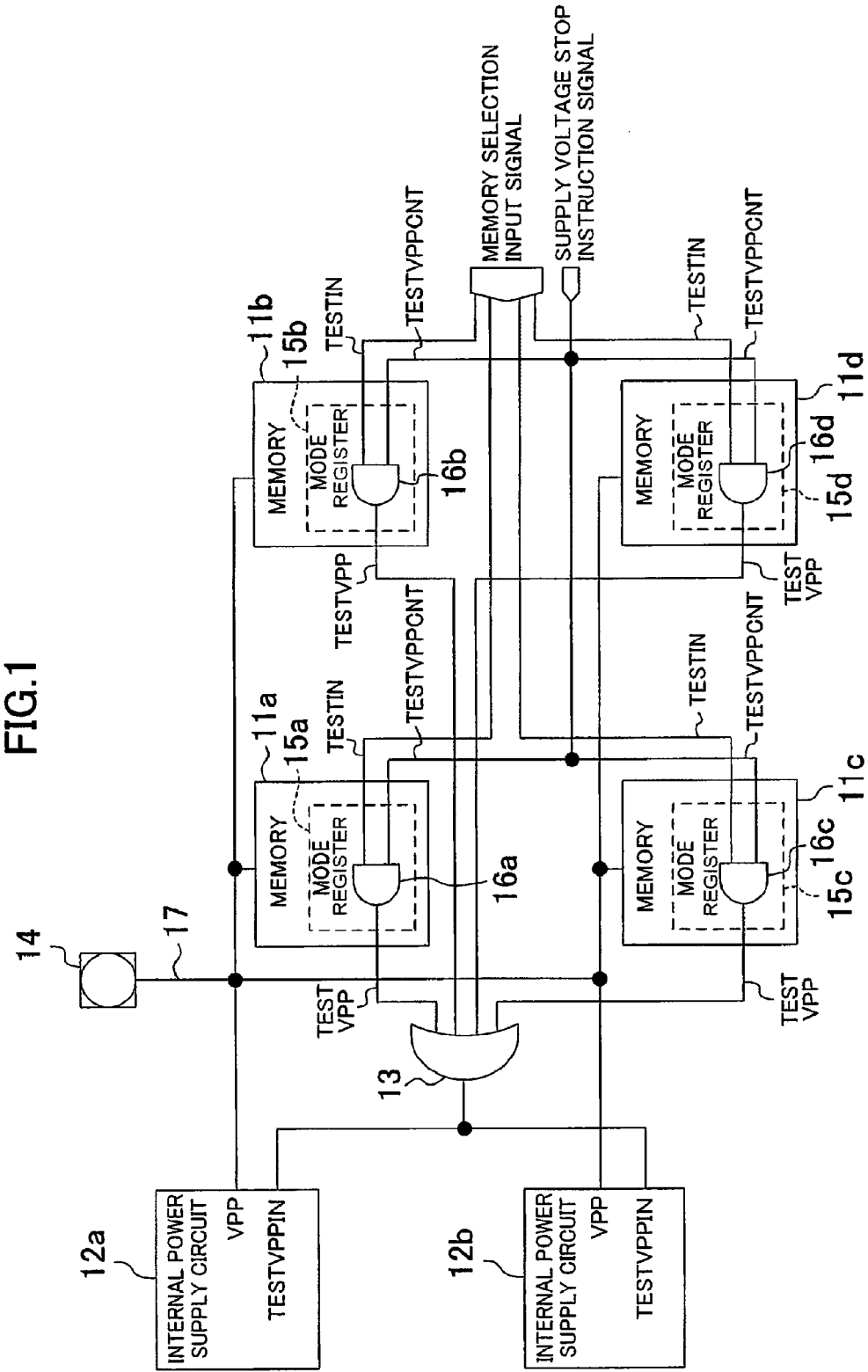
FIG. 1 is a block diagram illustrating the main structure of a semiconductor integrated circuit according to a first embodiment of the present invention.

Hereinafter, embodiments of the present invention are described with reference to the drawings. In the following embodiments, constituents of the same function are indicated by the same reference numeral to omit explanation.

First Embodiment

FIG. 1 is a block diagram illustrating the main structure of a semiconductor integrated circuit according to a first embodiment of the present invention. As shown in the diagram, the semiconductor integrated circuit includes memories 11a to 11d (a plurality of circuit blocks), internal power supply circuits 12a and 12b, an OR circuit 13 (a logical sum circuit) and an external pad 14. The semiconductor integrated circuit is a single chip system LSI and further includes a logic circuit block (not shown).

The memories 11a to 11d are configured to receive memory selection input signals TESTIN (circuit block test control signals) for placing the memories in a test state (test mode), respectively, and a supply voltage stop instruction signal TESTVPPCNT for instructing to stop the supply voltage. When the supply voltage stop instruction signal TESTVPPCNT is at a H (High) level, the internal power supply circuits 12a and 12b stop the delivery of the supply voltage. On the other hand, when the supply voltage stop instruction signal TESTVPPCNT is at a L (Low) level, the internal power supply circuits 12a and 12b deliver the supply voltage. The memory selection input signals TESTIN separately correspond to the memories 11a to 11d, while the supply voltage stop instruction signal TESTVPPCNT is a shared signal for the memories 11a to 11d. The memories 11a to 11d include mode registers 15a to 15d, respectively. The mode registers 15a to 15d include AND circuits 16a to 16d, respectively, and each of the AND circuits 16a to 16d outputs a signal TESTVPP, which is a logical product of the corresponding memory selection input signal TESTIN and the supply voltage stop instruction signal TESTVPPCNT. The signals TESTVPP output from the mode registers 15a to 15d are delivered out of the memories 11a to 11d, respectively. The memory selection input signals TESTIN and the supply voltage stop instruction signal TESTVPPCNT may be input through external pads (not shown) different from the external pad 14. The supply voltage stop instruction signal TESTVPPCNT is switched to the L level when the outputs of the internal power supply circuits 12a and 12b are monitored through the external pad 14, or to the H level when the supply voltage is applied to the memories 11a to 11d by the external pad 14. The memories 11a to 11d are operated when they are placed in the test state by the corresponding memory selection input signals TESTIN. When not in the test state, the memories 11a to 11d are placed in a standby state. The memories 11a to 11d are dynamic random access memories.

Both of the internal power supply circuits 12a and 12b are controlled by a common power supply control signal TESTVPPIN as to whether or not to deliver a common supply voltage VPP to the memories 11a to 11d. For example, when the power supply control signal TESTVPPIN is at the L level, the supply voltage VPP is delivered equally to the memories 11a to 11d. On the other hand, when the power supply control signal TESTVPPIN is at the H level, the outputs of the internal power supply circuits 12a and 12b are placed in a high impedance state. Output voltage trimming may be made on the internal power supply circuits 12a and 12b.

The memories 11a to 11d and the internal power supply circuits 12a and 12b are connected to each other by a shared power supply interconnection 17.

The OR circuit 13 outputs a power supply control signal TESTVPPIN, which is a logical sum of the signals TESTVPP delivered from the memories 11a to 11d to control the internal power supply circuits 12a and 12b. The power supply control signal TESTVPPIN is input to both of the internal power supply circuits 12a and 12b.

The logic circuit block (not shown) is operated by a supply voltage directly input through a different external pad than the external pad 14. For example, the supply voltage VPP delivered from the internal power supply circuits 12a and 12b to the memories 11a to 11d is set equal to or higher than the supply voltage delivered to the logic circuit block.

Next, explanation of the operation of the thus-configured semiconductor integrated circuit is provided below.

For the inspection of the semiconductor integrated circuit (test mode), only the memory 11a is placed in a test state by the memory selection input signal TESTIN and the output of the internal power supply circuits 12a and 12b is monitored by the external pad 14. In this state, the supply voltage stop instruction signal TESTVPPCNT is at the L level. Accordingly, the logical product of the supply voltage stop instruction signal TESTVPPCNT output from the AND circuit 16a of the memory 11a and the memory selection input signal TESTIN, i.e., the signal TESTVPP, is at the L level. The L level signal TESTVPP is then output from the mode register 15a and delivered out of the memory 11a. At this time, the signals TESTVPP output from the memories 11b to 11d are also at the L level. The signals TESTVPP from the memories 11a to 11d are input to the OR circuit 13, and then a power supply control signal TESTVPPIN at the L level is input to both of the internal power supply circuits 12a and 12b from the OR circuit 13. As a result, both of the internal power supply circuits 12a and 12b stand ready to deliver the supply voltage VPP (active state) and the supply voltage VPP is delivered to the memories 11a to 11d. The supply voltage VPP delivered through the shared power supply interconnection 17 is monitored by a memory tester via the external pad 14 connected to the shared power supply interconnection 17. Ideally, the internal power supply circuits 12a and 12b are configured to output the same supply voltage when they are operated separately. If their outputs are varied from each other due to the variations in the manufacturing process, the supply voltage delivered from one of the internal power supply circuits having a higher target voltage is monitored at the shared power supply interconnection 17. The output of the other internal power supply circuit having a lower target voltage is placed in a high impedance state.

The above explanation is directed to the case where only the memory 11a is placed in the test state. However, if some of the memories 11a to 11d are placed in the test state by the corresponding memory selection input signals TESTIN, the voltage of the shared power supply interconnection 17 is monitored in the same manner.

In order to adjust the voltage of the shared power supply interconnection 17 to a desired level, voltage trimming may be made on both of the internal power supply circuits 12a and 12b in the same manner such that a desired voltage is obtained in the monitoring. For example, when the voltage of the shared power supply interconnection 17 is lower than the desired voltage by 0.2 V, voltage trimming is made on both of the internal power supply circuits 12a and 12b to increase their target voltages by 0.2 V to adjust the voltage of the shared power supply interconnection 17 to the desired level. However, if the target voltages of the internal power supply circuits 12a and 12b are different from each other due to the variations in the manufacturing process and the output of one of the internal power supply circuits whose target voltage is low is placed in the high impedance state before the voltage trimming, the output of the internal power supply circuit with the lower target voltage remains in the high impedance state even after the voltage trimming is carried out to both of the internal power supply circuits 12a and 12b in the same manner.

In order to adjust the output of one of the internal power supply circuits 12a and 12b, the target voltage of the other internal power supply circuit is temporarily reduced by voltage trimming. Then, the voltage of the shared power supply interconnection 17 is monitored and the output voltage of the former internal power supply circuit is adjusted. As the target voltage is reduced, the output of the latter internal power supply circuit is placed in the high impedance state. As a result, the voltage of the former internal power supply circuit is output as the voltage of the shared power supply interconnection 17. Then, the voltage of the shared power supply interconnection 17, i.e., the output voltage of the former internal power supply circuit, is monitored and adjusted by voltage trimming. If the internal power supply circuit to be monitored is changed and then the monitoring and the adjustment are carried out in the same manner, the output voltages of both of the internal power supply circuits 12a and 12b are adjusted.

By the above-described technique, the output voltages of the internal power supply circuits 12a and 12b are separately adjusted to be the same desired voltage. Therefore, when the current is consumed by the memories, the current supply is achieved in an ideal manner with respect to variations in voltage assumed on the design stage by the two internal power supply circuits 12a and 12b as they show the same current supply characteristics.

Next, explanation of how the semiconductor integrated circuit is operated during the inspection thereof is provided below. For the inspection of the semiconductor integrated circuit (test mode), only the memory 11a is placed in the test state (test mode) by the memory selection input signal TESTIN and an external supply voltage is applied to the memory 11a through the external pad 14. In this case, the supply voltage stop instruction signal TESTVPPCNT is at the H level. Accordingly, the logical product of the supply voltage stop instruction signal TESTVPPCNT output from the AND circuit 16a of the memory 11a and the memory selection input signal TESTIN, i.e., the signal TESTVPP, is at the H level. The H level signal TESTVPP is then output from the mode register 15a and delivered out of the memory 11a. At this time, the signals TESTVPP output from the memories 11b to 11d are at the L level. The signals TESTVPP from the memories 11a to 11d are input to the OR circuit 13, and then a power supply control signal TESTVPPIN at the H level is input to both of the internal power supply circuits 12a and 12b from the OR circuit 13. As a result, the outputs (output terminals) of both of the internal power supply circuits 12a and 12b are placed in the high impedance state (the internal power supply circuits 12a and 12b are placed in an inactive state). Then, a predetermined voltage is applied to the memory 11a from the external pad 14. Since the memories 11b to 11d are in the standby state at this time, no current is consumed by them and problems do not occur in the inspection.

As described above, in the inspection of the semiconductor integrated circuit, the operation of the memories 11a to 11d is controlled by the memory selection input signals TESTIN and the operation of the internal power supply circuits 12a and 12b is controlled by the combination of the memory selection input signals TESTIN and the supply voltage stop instruction signal TESTVPPCNT. Thus, the voltage monitoring on the power supply interconnection, the voltage adjustment (setting) and the voltage application are carried out easily through the external pad 14.

The above explanation is directed to the case where the voltage is applied only to the memory 11a from the external pad 14. However, if some of the memories 11a to 11d are placed in the test state by the memory selection input signals TESTIN, the voltage may be applied to these memories.

According to the semiconductor integrated circuit of the present embodiment, the single external pad 14 is shared between the internal power supply circuits 12a and 12b. This makes it possible to reduce the number of external pads used for monitoring the voltages of the power supply interconnections. Even if a plurality of memories are provided in the system LSI and a large number of internal power supply circuits are provided for maintaining high drive performance, the number of the external pads is prevented from increasing.

According to the present embodiment, the semiconductor integrated circuit is configured such that the outputs of the internal power supply circuits 12a and 12b are placed in the high impedance state when the signal TESTVPPIN is at the H level. Therefore, there is no need of providing additional circuit such as a switch between the shared power supply interconnection 17 and the internal power supply circuits 12a and 12b for the inspection. As the circuit such as the switch is not necessary, design time is reduced.

Further, the sharing of the single external pad 14 between the internal power supply circuits 12a and 12b is particularly effective in reducing the number of the pads in a circuit in which the memories consume a large amount of current during operation. To be more specific, in general, the circuit in which a large amount of current is consumed by the memories includes a lot of internal power supply circuits. Therefore, if the shared external pad is utilized, the number of the pads is significantly reduced as compared with the case where the external pads are provided in one to one correspondence with the internal power supply circuits. For example, when the internal power supply circuits 12a and 12b are configured to generate a voltage equal to the voltage for a logic circuit mounted on the same chip or a voltage higher than the voltage for operating the memories, the shared external pad is effectively used for the reduction of the number of the external pads.

The memories 11a to 11d are not limited to the dynamic random access memories. Any other kinds of memories may be used as long as they can be mounted on the system LSI.

Figure 2:
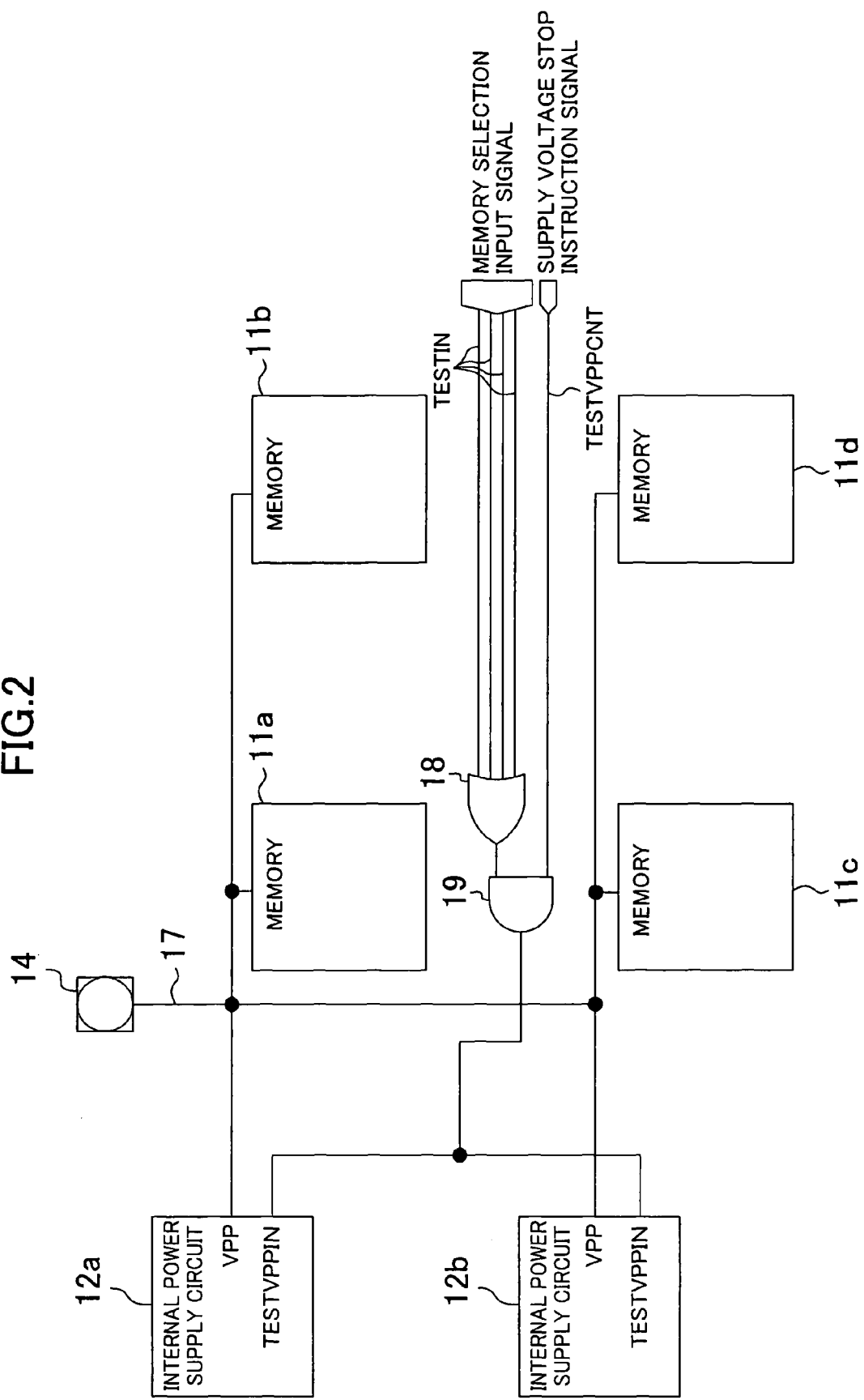
FIG. 2 is a block diagram illustrating the main structure of a modification of the semiconductor integrated circuit according to the first embodiment.

In the present embodiment, the power supply control signal TESTVPPIN is generated by the AND circuits 16a to 16d, each of which outputs a logical product of the memory selection input signal TESTIN and the supply voltage stop instruction signal TESTVPPCNT, and the OR circuit 13 which outputs a logical sum of the logical products. However, the structure of the circuit for generating the power supply control signal TESTVPPIN is not limited thereto. For example, as shown in FIG. 2, the power supply control signal TESTVP-PIN may be generated by an OR circuit 18 which delivers a logical sum of the memory selection input signals TESTIN for the memories and an AND circuit 19 which delivers a logical product of the logical sum output from the OR circuit 18 and the supply voltage stop instruction signal TESTVP-PCNT.

Second Embodiment

Figure 3:
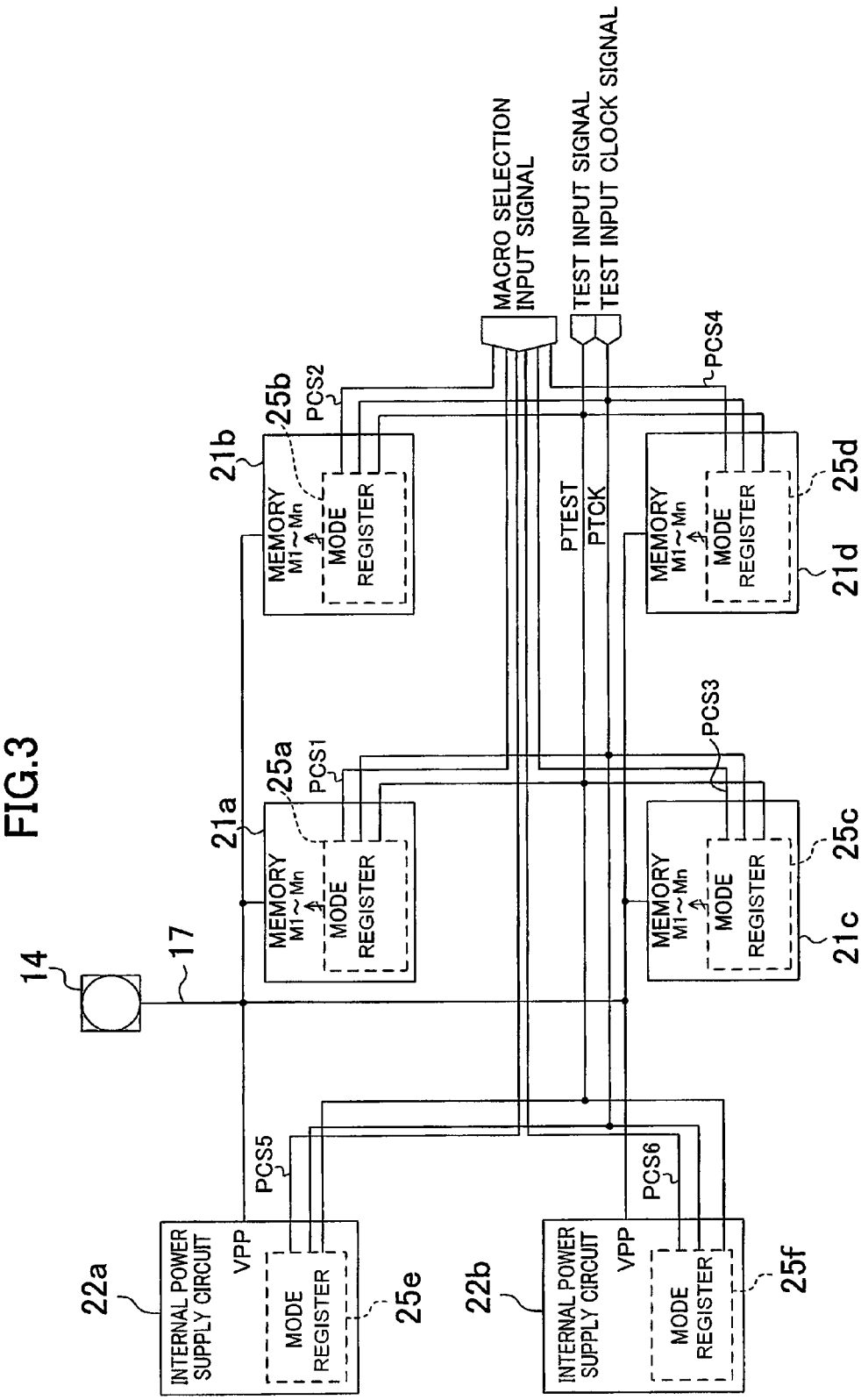
FIG. 3 is a block diagram illustrating the main structure of a semiconductor integrated circuit according to a second embodiment of the present invention.

FIG. 3 is a block diagram illustrating the main structure of a semiconductor integrated circuit according to a second embodiment of the present invention. As shown in the diagram, the semiconductor integrated circuit of the present embodiment includes memories 21a to 21d (a plurality of circuit blocks), internal power supply circuits 22a and 22b and an external pad 14. The memories 21a to 21d and the internal power supply circuits 22a and 22b include mode registers 25a to 25f, respectively. The semiconductor integrated circuit is a single chip system LSI and further includes a logic circuit block (not shown).

The memories 21a to 21d and the internal power supply circuits 22a and 22b are configured to receive corresponding macro selection input signals PCS1 to PCS6, respectively. Further, the memories 21a to 21d and the internal power supply circuits 22a and 22b receive a test input signal PTEST and a test input clock signal PTCK which are common to the memories and the circuits.

The memories 21a to 21d are switched between a test state and a standby state by mode set control signals M1 to Mn generated by (stored in) the corresponding mode registers 25a to 25d. Although the description does not refer to the other modes than the two modes, the memories 21a to 21d may be operated in various kinds of modes under the control of the mode set control signals M1 to Mn.

The internal power supply circuits 22a and 22b are controlled by the mode set control signals M1 to Mn generated by (stored in) the corresponding mode registers 25e and 25f, respectively, as to whether to deliver an internal supply voltage VPP to the memories 21a to 21d or to place the output in the high impedance state (high-Z). Although the description does not refer to the other modes than the two modes, the internal power supply circuits 22a and 22b may be operated in various kinds of modes under the control of the mode set control signals M1 to Mn. Voltage trimming may be performed on the output voltages of the internal power supply circuits 22a and 22b.

Thus, each of the memories 21a to 21d and the internal power supply circuits 22a and 22b are operated in the mode corresponding to the mode set control signals M1 to Mn.

Figure 4:
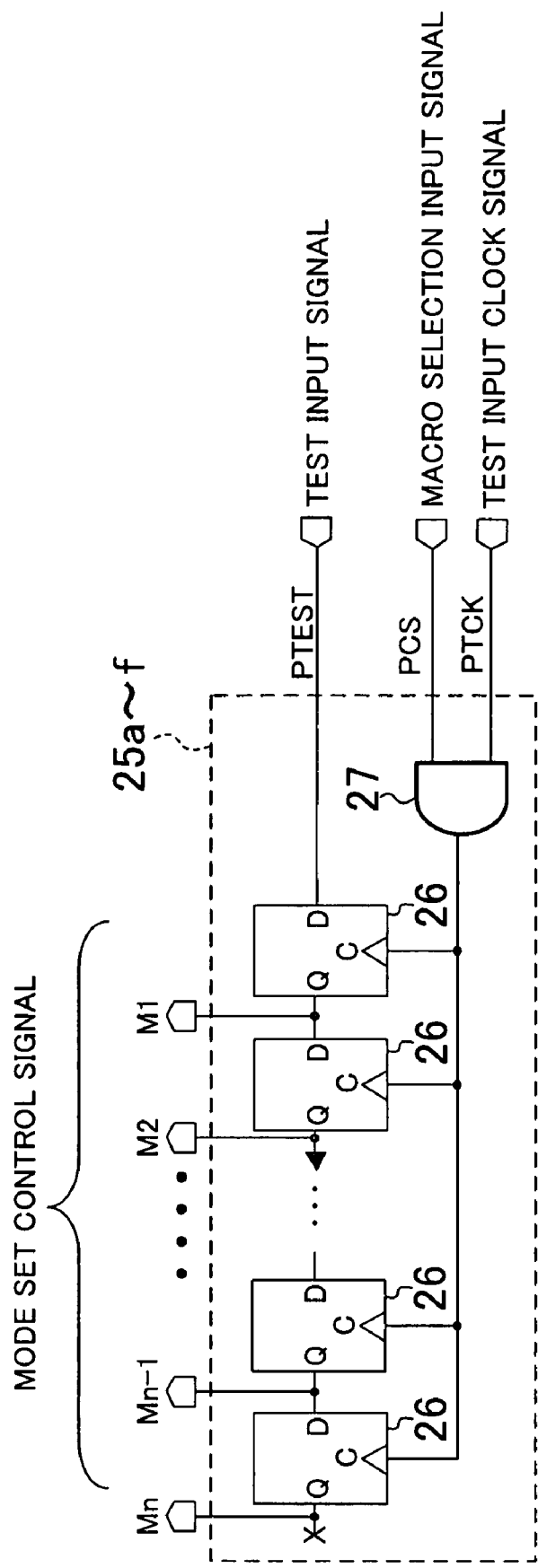
FIG. 4 is a block diagram illustrating the structure of mode registers 25a to 25f according to the second embodiment.

The mode registers 25a to 25f function to set the modes of the memories 21a to 21d and the internal power supply circuits 22a and 22b, respectively. To be more specific, each of the mode registers 25a to 25f includes a plurality of D flip-flops 26 and an AND circuit 27 as shown in FIG. 4. Each of the mode registers 25a to 25f receives the test input signal PTEST, a corresponding one of the macro selection input signals PCS1 to PCS6 and the test input clock signal PTCK. Depending on these input signals, each of the mode registers 25a to 25f generates the mode set control signals M1 to Mn. When the corresponding one of the macro selection input signals PCS1 to PCS6 is at the H level, each of the mode registers 25a to 25f updates the stored mode set control signals to a value corresponding to the test input signal PTEST. In the memories 21a to 21d and the internal power supply circuits 22a and 22b selected by the macro selection input signals PCS1 to PCS6, the mode set control signals M1 to Mn are activated by the test input signal PTEST common to the memories 21a to 21d and the internal power supply circuits 22a and 22b.

As described above, the modes of the memories 21a to 21d and the internal power supply circuits 22a and 22b having different functions are set by the mode registers 25a to 25f which execute the same function. Therefore, a malfunction does not occur during the inspection. For example, the selected circuit block and internal supply voltage circuit are not placed in different modes by a certain mode set control signal.

As the mode registers 25a to 25f are configured identically, the number of man-hour required for designing the mode registers is reduced. However, the mode registers having the same function and different circuit structures may be used to reduce the area for the mode registers.

The macro selection input signals PCS1 to PCS6 are set to the H level (active state) to select (specify) the corresponding internal power supply circuits 22a and 22b and the memories 21a to 21d. When the corresponding internal power supply circuits 22a and 22b and the memories 21a to 21d are not selected (specified), the macro selection input signals are set to the L level.

Now, explanation of how the level of the internal supply voltage VPP delivered (generated) by the internal power supply circuit 22b is monitored and how the voltage is set to a desired level in the thus-configured semiconductor integrated circuit is provided below.

In this operation, the test input signal PTEST representing a mode in which one of the internal power supply circuits 22a and 22b is deactivated, i.e., a mode in which the output from the one of the internal power supply circuits 22a and 22b to the memories 21a to 21d is placed in a high impedance state, is serially input bit by bit to the mode registers 25a to 25f in synchronization with the test input clock signal PTCK. Simultaneously, the macro selection input signal PCS5 is turned to the H level. Accordingly, the test input clock signal PTCK is input as a clock signal to the D flip-flops 26 of the mode register 25e. As a result, the value of the test input signal PTEST is output in a parallel manner as the mode set control signals M1 to Mn after a lapse of a certain clock period. In response to the mode set control signals M1 to Mn, the output of the internal power supply circuit 22a to the memories 21a to 21d is placed in the high impedance state. In this state, the internal supply voltage VPP generated by the internal power supply circuit 22b is output to the external pad 14. Thus, the level of the internal supply voltage VPP is controlled to a desired level through monitoring.

As described above, in the semiconductor integrated circuit of the present embodiment, the plurality of internal power supply circuits include the mode registers, respectively, and the modes of the internal power supply circuits are controlled separately by the combination of the macro selection input signals for specifying one of the internal power supply circuits and the test input signal shared between the internal power supply circuits. Therefore, the number of the pads is effectively reduced. Even if the internal power supply circuits generate different internal supply voltages VPP due to variations in the manufacturing process, the internal supply voltages VPP generated by the internal power supply circuits are controlled to the same desired voltage by selecting the mode with the test input signal. For example, the internal supply voltages VPP generated by the internal power supply circuits 22a and 22b to operate the memories 21a to 21d in a normal working state are controlled to the same level irrespective of the variations in the manufacturing process. Therefore, the internal supply voltage is controlled to the designed value and the reliability of the LSI is improved.

As a circuit for the inspection of the internal power supply circuits in the system LSI is achieved by merely connecting the interconnections, the man-hour required for designing the test circuit is significantly reduced.

In the semiconductor integrated circuit of the present embodiment, the number of the internal power supply circuits for delivering the internal supply voltage VPP is changeable in accordance with the test mode selected by the test input signal. This makes it easy to check the number of the internal power supply circuits required in accordance with the number of the memories 21a to 21d to be operated. That is, the optimum number of the internal power supply circuits is determined with use of an actual device.

In the mode of inspecting the internal power supply circuits 22a and 22b, i.e., in the mode in which there is no need of placing the memories 21a to 21d in the test mode, the mode of the memories 21a to 21d is not changed even if a certain mode set control signal is activated.

In the test mode, one or more of the memories 21a to 21d and the internal power supply circuits 22a and 22b are selected by one or more of the macro selection input signals PCS1 to PCS6. That is, one of the macro selection input signals PCS1 to PCS6 may be set to the H level or some of the macro selection input signals PCS1 to PCS6 may be set to the H level in any combination.

Thus, some of the memories 21a to 21d and the internal power supply circuits 22a and 22b are optionally selected as circuit macros in the system LSI. Therefore, a check is easily made as to the relationship between the number of the memories 21a to 21d placed in the test mode and the number of the internal power supply circuits 22a and 22b for supplying the internal supply voltage VPP.

Further, voltage trimming is performed on the internal supply voltages VPP from the internal power supply circuits 22a and 22b. Specifically, the output voltages of the internal power supply circuits 22a and 22b are trimmed with use of a fuse such that normal operation is achieved at the internal supply voltages VPP set to the same voltage level. Therefore, the LSI is achieved without effects of the variations in the manufacturing process.

Third Embodiment

Figure 5:
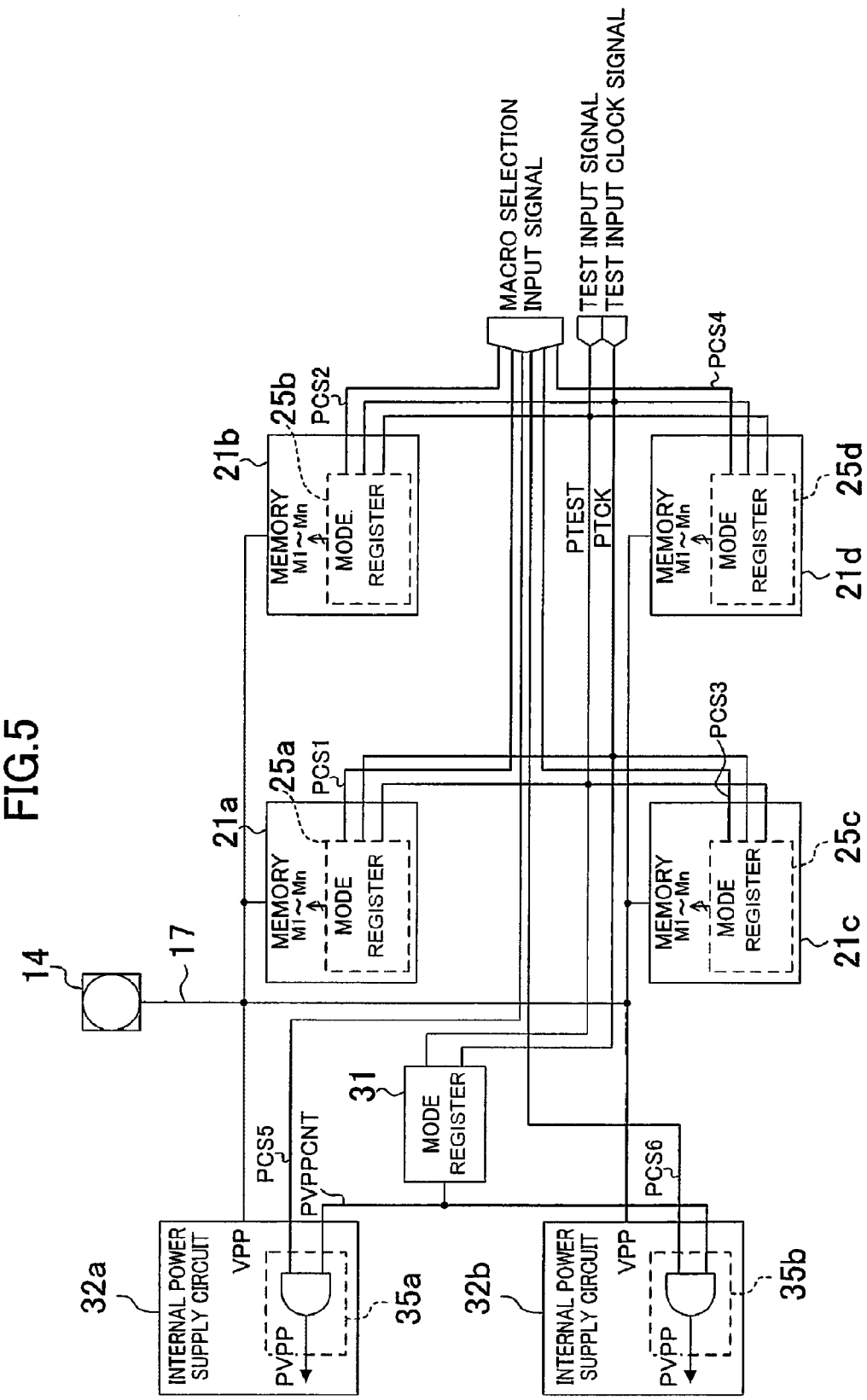
FIG. 5 is a block diagram illustrating the main structure of a semiconductor integrated circuit according to a third embodiment of the present invention.

FIG. 5 is a block diagram illustrating the main structure of a semiconductor integrated circuit according to a third embodiment of the present invention. As shown in the diagram, the semiconductor integrated circuit of the present embodiment is different from that of the second embodiment in that a mode register 31 (a mode register for internal power supply circuits) is provided and the internal power supply circuits 22a and 22b are replaced with internal power supply circuits 32a and 32b. The semiconductor integrated circuit is a single chip system LSI and further includes a logic circuit block (not shown) just like the semiconductor integrated circuit of the second embodiment.

The mode register 31 has substantially the same structure as the mode registers 25a to 25d (mode registers for circuit blocks) shown in FIG. 4. However, the mode register 31 is different from the mode registers 25a to 25d in that the voltage at an input terminal of an AND circuit 27 for the macro selection input signals is fixed to the H level. The mode register 31 outputs an internal power supply circuit control signal PVPPCNT in accordance with the mode set control signals M1 to Mn. The internal power supply circuit control signal PVPPCNT is set to the H level (active state) to place the output of the internal power supply circuits 32a and 32b in the high impedance state or to the L level when the high impedance state is not required.

The internal power supply circuits 32a and 32b are operated in the mode corresponding to the mode set control signals M1 to Mn stored in the mode register 31 when the corresponding macro selection input signals PCS5 and PCS6 are at the H level. To be more specific, the internal power supply circuits 32a and 32b include control circuits 35a and 35b, respectively. Each of the control circuits 35a and 35b includes an AND circuit which delivers a signal PVPP, which is a logical product of the internal power supply circuit control signal PVPPCNT output from the mode register 31 and the corresponding macro selection input signal PCS5 or PCS6. When the signal PVPP output from the control circuit 35a or 35b is at the H level, the output of the internal power supply circuit 32a or 32b is placed in the high impedance state. When the control circuit 35a or 35b output the signal PVPP at the L level, the internal power supply circuits 32a or 32b delivers the internal supply voltage VPP to the memories 21a to 21d.

Now, explanation of how the level of the internal supply voltage VPP delivered (generated) by the internal power supply circuit 32b is monitored and how the voltage is set to a desired level in thus-configured semiconductor integrated circuit is provided below.

In this operation, a test input signal PTEST representing a mode in which one of the internal power supply circuits 32a and 32b is deactivated, i.e., a mode in which the output from the one of the internal power supply circuits 32a and 32b to the memories 21a to 21d is placed in a high impedance state, is serially input to the mode registers 25a to 25d and 31 in synchronization with a test input clock signal PTCK. The test input signal PTEST is input to the mode register 31, and then the internal power supply circuit control signal PVPPCNT for placing the internal power supply circuits 32a and 32b in the high impedance state is set to the H level in the mode register 31. At the same time, the macro selection input signal PCS5 is also set to the H level, and therefore the signal PVPP output by the AND circuit of the control circuit 35a is switched to the H level. As a result, the output of the internal power supply circuit 32a is placed in the high impedance state. In this state, the internal supply voltage VPP generated by the internal power supply circuit 32b is output to the external pad 14, where the internal supply voltage VPP is monitored and adjusted to the desired voltage level. In this manner, the single mode register 31 is shared to control the internal power supply circuits 32a and 32b. Therefore, the area for the mode registers is reduced, thereby reducing the area of the system LSI.

The mode registers 25a to 25d corresponding to the memories 21a to 21d and the mode register 31 may be provided as a single mode register. In this case, the circuit is designed in preference to reduction in area in consideration of the effect of reducing the area for the mode registers and the area for interconnections for passing the output signals of the mode registers.

Fourth Embodiment

Figure 6:
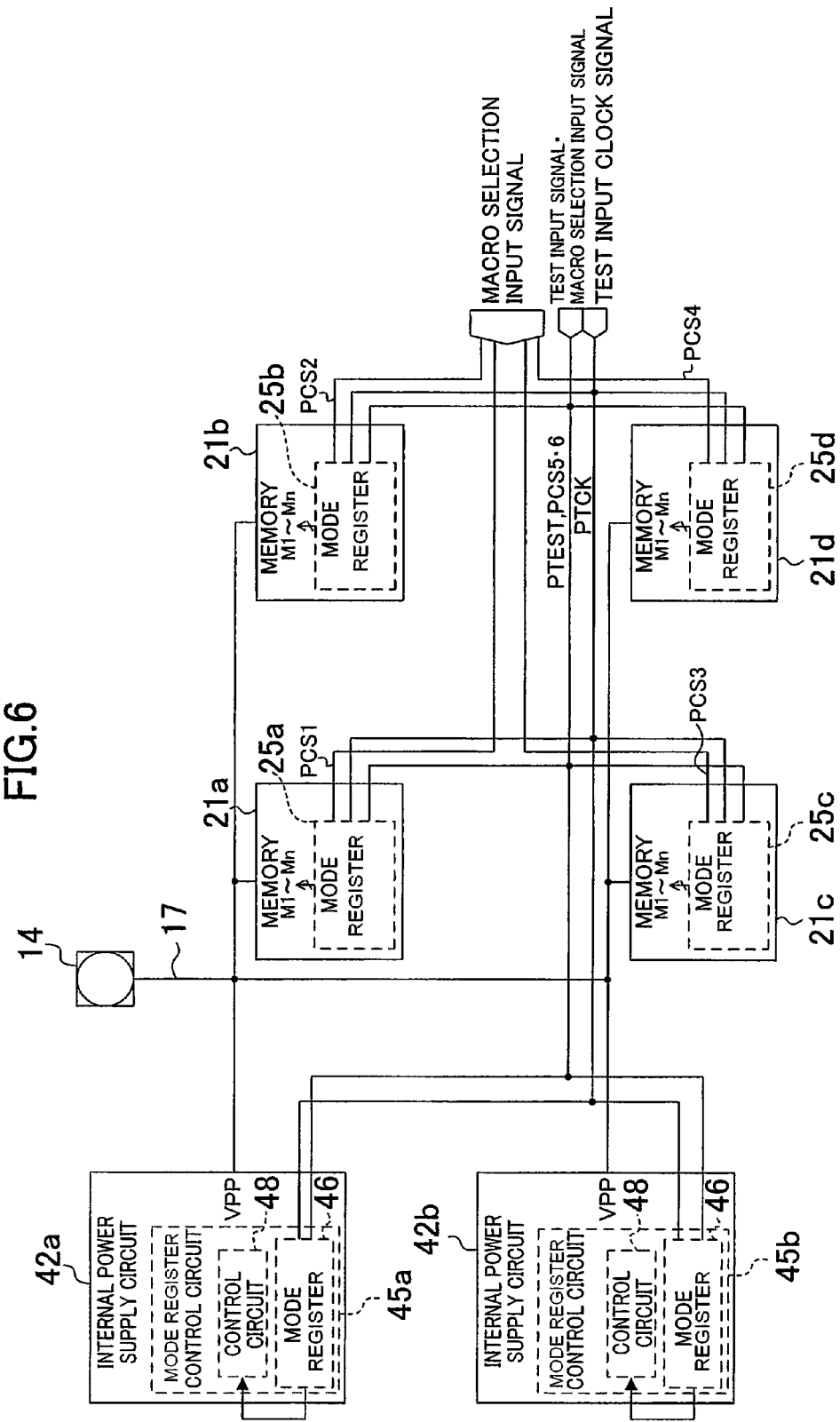
FIG. 6 is a block diagram illustrating the main structure of a semiconductor integrated circuit according to a fourth embodiment of the present invention.

FIG. 6 is a block diagram illustrating the main structure of a semiconductor integrated circuit according to a fourth embodiment of the present invention. As shown in the diagram, the semiconductor integrated circuit of the present embodiment is different from that of the second embodiment in that the internal power supply circuits 22a and 22b are replaced with internal power supply circuits 42a and 42b. The semiconductor integrated circuit is a single chip system LSI and further includes a logic circuit block (not shown) just like the semiconductor integrated circuit of the second embodiment.

The internal power supply circuits 42a and 42b includes mode register control circuits 45a and 45b, respectively.

Figure 7:
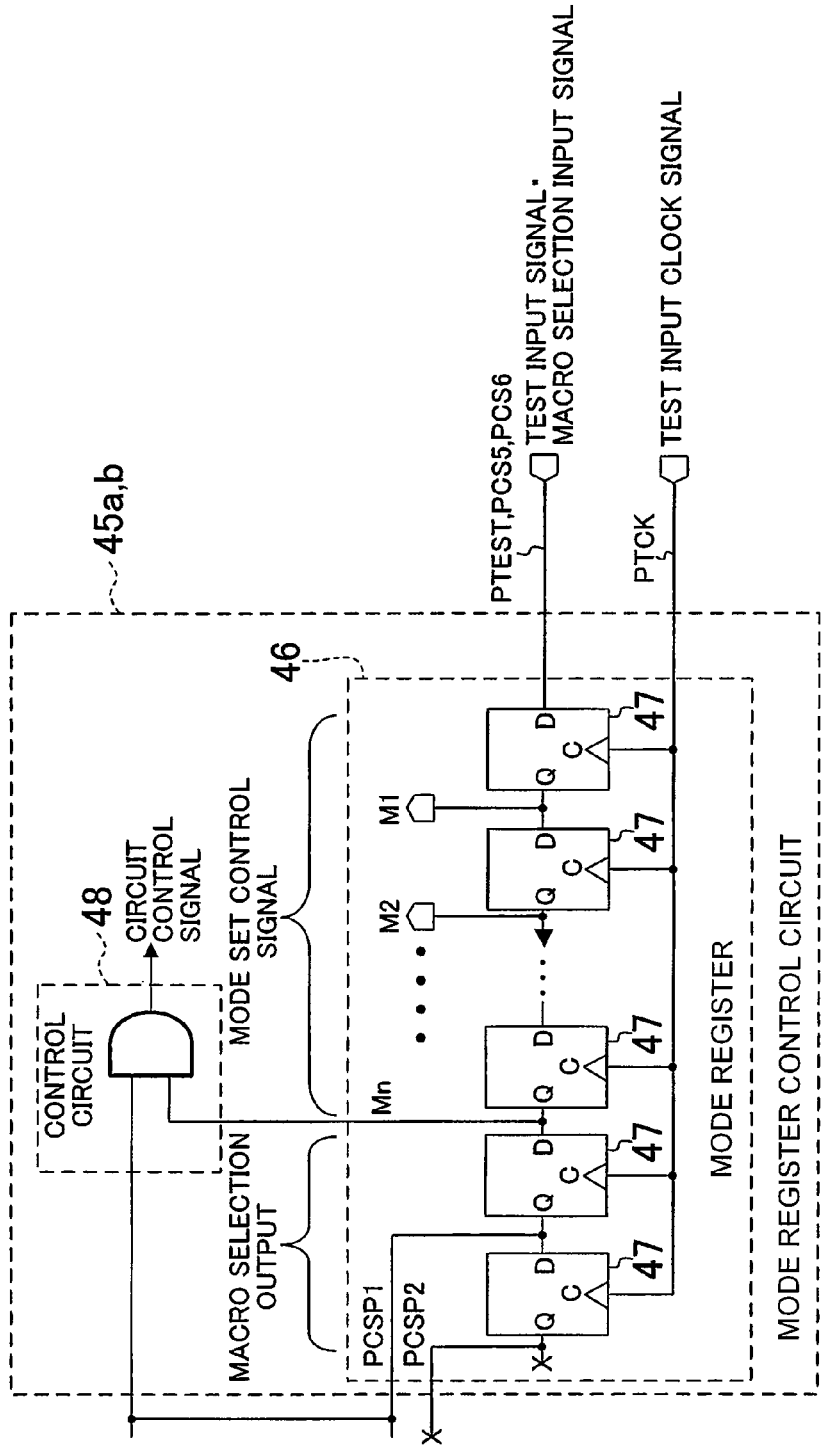
FIG. 7 is a block diagram illustrating the structure of mode register control circuits 45a and 45b according to the fourth embodiment.

Each of the mode register control circuits 45a and 45b includes a mode register 46 and a control circuit 48 as shown in FIG. 7. The mode register 46 includes a plurality of D flip flops 47. The control circuit 48 includes an AND circuit and outputs a circuit control signal.

The internal power supply circuits 42a and 42b place their outputs in a high impedance state (Hi-Z) when the circuit control signals delivered from the corresponding mode register control circuits 45a and 45b are at the H level. When the circuit control signals are at the L level, the internal power supply circuits 42a and 42b deliver an internal power supply voltage VPP to the memories 21a to 21d.

Now, explanation of how the level of the internal supply voltage VPP delivered (generated) by the internal power supply circuit 42b is monitored and how the voltage is set to a desired level in the thus-configured semiconductor integrated circuit is provided below.

In this operation, a test input signal PTEST representing a mode in which one of the internal power supply circuits 42a and 42b is deactivated, i.e., a mode in which the output of the one of the internal control circuits 42a and 42b is placed in the high impedance state, a macro selection input signal PCS5 indicating whether or not to select the internal power supply circuit 42a and a macro selection input signal PCS6 indicating whether or not to select the internal power supply circuit 42b are serially input bit by bit to the mode register control circuits 45a and 45b in synchronization with a test input clock signal PTCK. At this time, the macro selection input signal PCS5 is at the H level. Therefore, a mode select output signal Mn and a macro selection output signal PCSP1 output from the mode register control circuits 45a and 45b are turned to the H level by these input signals. As a result, the circuit control signal is switched to the H level (activated) in the internal power supply circuit 42a and the output of the internal power supply circuit 42a is placed in the high impedance state. On the other hand, in the mode register control circuit 45b, a L level macro selection output signal PCSP2 is input in the control circuit 48. Therefore, the internal power supply circuit 42b does not enter the test mode, but outputs the internal supply voltage VPP. Thus, when the macro selection output signal PCSP1 and PCSP2 (selection signals) stored in the corresponding mode registers 46 indicates to select the internal power supply circuit 42a and 42b, respectively, the internal power supply circuits 42a and 42b are operated in the mode corresponding to the mode set control signal stored in the corresponding mode registers 46.

As described above, in the semiconductor integrated circuit of the present embodiment, the macro selection input signals for selecting the internal power supply circuits 42a and 42b are input as serial signals successively with the test input signal. Therefore, there is no need of providing the interconnections for the macro selection input signals and the number of the interconnections connected to the internal power supply circuits is reduced. This makes it easy to design the test circuit and makes it possible to reduce the LSI area.

The macro selection input signals PCS5 and PCS6 for selecting the internal power supply circuits 42a and 42b are input to the internal power supply circuits 42a and 42b through the same path as the test signal PTEST. The internal power supply circuits 42a and 42b output the macro selection output signals PCSP1 and PCSP2 through different paths. Then, one of the macro selection output signals PCSP1 and PCSP2 delivered from the internal power supply circuits 42a and 42b is input to the AND circuit of the control circuit 48 of one of the internal power supply circuits 42a and 42b.

The two internal power supply circuits 42a and 42b including the mode register control circuits 45a and 45b, respectively, store both of the macro selection input signals PCS5 and PCS6 and function as circuit blocks (macros) having the same circuit structure. Therefore, the test circuit for the system LSI is obtained by merely designing the internal power supply circuits of a single kind and connecting necessary interconnections to the external terminals of the internal power supply circuits 42a and 42b. This makes it possible to reduce the man-hour taken to design the internal power supply circuits 42a and 42b. Further, as there is no need of routing signal lines for the macro selection input signals PCS5 and PCS6 in the chip, the interconnection area is also reduced.

The explanation in the first to fourth embodiments is directed to the case where the two internal power supply circuits and the four memories are provided in the circuit. However, the voltage monitoring and the voltage application can be carried out with a single external pad irrespective of the number of the internal power supply circuits and the memories. Therefore, the number of the internal power supply circuits is easily changed in accordance with the number of the memories mounted on the system LSI.

The present invention may also be applicable to the structure in which a supply voltage from a plurality of internal power supply circuits is applied not to a plurality of memories but to a plurality of logic circuit blocks. For example, the memories 11a to 11d may be replaced with four logic circuit blocks and the supply voltage from the internal power supply circuits 12a and 12b may be applied to the logic circuit blocks. Even in this case, the number of the pads is reduced effectively. That is to say, the effect of the present invention is achieved in the structure where a common supply voltage is applied from the plurality of internal power supply circuits to the plurality of circuit blocks.

The semiconductor integrated circuit of the present invention has the effect of reducing the number of the pads used in the semiconductor integrated circuit including a plurality of internal power supply circuits. For example, the present invention is useful as a semiconductor integrated circuit including dynamic random access memories and the like for use in various appliances such as digital appliances.

What is claimed is:

1. A semiconductor integrated circuit including on a single chip a plurality of circuit blocks and a plurality of internal power supply circuits for delivering a common supply voltage to the plurality of circuit blocks, the semiconductor integrated circuit comprising:

a shared power supply interconnection for connecting the plurality of circuit blocks and the plurality of internal power supply circuits;

an external pad connected to the shared power supply interconnection;

a plurality of AND circuits provided to correspond to the circuit blocks, each of which outputs a logical product of a circuit block test control signal which is switched to the H level to place the corresponding circuit block in the test mode and a supply voltage stop instruction signal which is switched to the H level to stop the delivery of the supply voltage; and an OR circuit which outputs a logical sum of the logical products delivered by the AND circuits as the power supply control signal, wherein whether or not each of the internal power supply circuits delivers the supply voltage is controlled by the power supply control signal when at least one of the plurality of circuit blocks is in the test mode.

2. The semiconductor integrated circuit of claim 1, wherein the outputs of the internal power supply circuits are placed in a high impedance state when the internal power supply circuits do not deliver the supply voltage.

3. The semiconductor integrated circuit of claim 1, wherein the circuit blocks are memories, a logic circuit block is provided on the same chip in addition to the memories and the common supply voltage delivered from the internal power supply circuits to the memories is not lower than a voltage supplied to the logic circuit block.

4. The semiconductor integrated circuit of claim 1, further comprising:

a plurality of mode registers for the circuit blocks provided to correspond to the circuit blocks and store mode set control signals for setting the modes of operations of the circuit blocks, respectively; and a plurality of mode registers for the internal power supply circuits provided to correspond to the internal power supply circuits and store mode set control signals for setting the modes of operations of the internal power supply circuits, respectively, wherein each of the plurality of mode registers updates the stored mode set control signal to a value corresponding to a common test input signal which is input to the circuit blocks and the internal power supply circuits when a macro selection input signal indicating to select the corresponding circuit block or the corresponding internal power supply circuit is input.

5. The semiconductor integrated circuit of claim 4, wherein one or more of the plurality of internal power supply circuits and circuit blocks are selected by the macro selection input signal during the test mode.

6. The semiconductor integrated circuit of claim 5, wherein voltage trimming is performed on the level of the supply voltage delivered from each of the plurality of internal power supply circuits.

7. The semiconductor integrated circuit of claim 1, further comprising:

a plurality of mode registers for the circuit blocks provided to correspond to the plurality of circuit blocks and store mode set control signals for setting the modes of operations of the circuit blocks, respectively; and a mode register for the internal power supply circuits shared among the plurality of internal power supply circuits and stores a mode set control signal for setting the modes of operations of the internal power supply circuits, wherein each of the plurality of mode registers for the circuit blocks updates the stored mode set control signal to a value corresponding to a common test input signal which is input to the circuit blocks and the internal power supply circuits when a macro selection input signal indicating to select the corresponding circuit block is input, and each of the plurality of internal power supply circuits updates the stored mode set control signal to a value corresponding to a common test input signal which is input to the circuit blocks and the internal power supply circuits when a macro selection input signal indicating to select the internal power supply circuit is input.

8. The semiconductor integrated circuit of claim 1, further comprising:

a plurality of mode registers provided to correspond to the internal power supply circuits, each of which stores a mode set control signal and a selection signal which indicates whether or not to select the corresponding internal power supply circuit, wherein each of the plurality of internal power supply circuits is operated in a mode corresponding to the mode set control signal stored in the corresponding mode registers when the selection signal stored in the corresponding mode registers indicates to select the internal power supply circuit.

9. The semiconductor integrated circuit of claim 8, wherein each of the plurality of mode registers stores, in addition to the selection signal indicating whether or not to select the corresponding internal power supply circuit, a selection signal indicating whether or not to select the other internal power supply circuits than the internal power supply circuit corresponding to the mode register.

10. A semiconductor integrated circuit including on a single chip a plurality of circuit blocks and a plurality of internal power supply circuits for delivering a common supply voltage to the plurality of circuit blocks, the semiconductor integrated circuit comprising:

a shared power supply interconnection for connecting the plurality of circuit blocks and the plurality of internal power supply circuits;

an external pad connected to the shared power supply interconnection, an OR circuit which outputs a logical sum of a plurality of circuit block test control signals which are switched to the H level to place the circuit blocks in a test mode; and an AND circuit which outputs a logical product of the logical sum and a supply voltage stop instruction signal which is switched to the H level to stop the delivery of the supply voltage as the power supply control signal, wherein whether or not each of the internal power supply circuits delivers the supply voltage is controlled by the power supply control signal when at least one of the plurality of circuit blocks is in the test mode.

11. The semiconductor integrated circuit of claim 10, wherein the outputs of the internal power supply circuits are placed in a high impedance state when the internal power supply circuits do not deliver the supply voltage.

12. The semiconductor integrated circuit of claim 10, wherein the circuit blocks are memories, a logic circuit block is provided on the same chip in addition to the memories, and the common supply voltage delivered from the internal power supply circuits to the memories is not lower than a voltage supplied to the logic circuit block.

13. The semiconductor integrated circuit of claim 10 further comprising:

a plurality of mode registers for the circuit blocks provided to correspond to the circuit blocks and store mode set control signals for setting the modes of operations of the circuit blocks, respectively, and a plurality of mode registers for the internal power supply circuits provided to correspond to the internal power supply circuits and store mode set control signals for setting the modes of operations of the internal power supply circuits, respectively, wherein each of the plurality of mode registers updates the stored mode set control signal to a value corresponding to a common test input signal which is input to the circuit blocks and the internal power supply circuits when a macro selection input signal indicating to select the corresponding circuit block or the corresponding internal power supply circuit is input.

14. The semiconductor integrated circuit of claim 10, wherein one or more of the plurality of internal power supply circuits and circuit blocks are selected by the macro selection input signal during the test mode.

15. The semiconductor integrated circuit of claim 14, wherein voltage trimming is performed on the level of the supply voltage delivered from each of the plurality of internal power supply circuits.

16. The semiconductor integrated circuit of claim 10 further comprising:

a plurality of mode registers for the circuit blocks provided to correspond to the plurality of circuit blocks and store mode set control signals for setting the modes of operations of the circuit blocks, respectively; and a mode register for the internal power supply circuits shared among the plurality of internal power supply circuits and stores a mode set control signal for setting the mode of operations of the internal power supply circuits, wherein each of the plurality of mode registers for the circuit blocks updates the stored mode set control signal to a value corresponding to a common test input signal which is input to the circuit blocks and the internal power supply circuits when a macro selection input signal indicating to select the corresponding circuit block is input, and each of the plurality of internal power supply circuits updates the stored mode set control signal to a value corresponding to a common test input signal which is input to the circuit blocks and the internal power supply circuits when a macro selection input signal indicating to select the corresponding internal power supply circuit is input.

17. The semiconductor integrated circuit of claim 10 further comprising:

a plurality of mode registers provided to correspond to the internal power supply circuits, each of which stores a mode set control signal and a selection signal which indicates whether or not to select the corresponding internal power supply circuit, wherein each of the plurality of internal power supply circuits is operated in a mode corresponding to the mode set control signal stored in the corresponding mode register when the selection signal stored in the corresponding mode register indicates to select the internal power supply circuit.

18. The semiconductor integrated circuit of claim 17, wherein each of the plurality of mode registers stores, in addition to the selection signal indicating whether or not to select the corresponding internal power supply circuit, a selection signal indicating whether or not to select the other internal power supply circuits than the internal power supply circuit corresponding to the mode register.

19. A semiconductor integrated circuit including on a single chip a plurality of circuit blocks and a plurality of internal power supply circuits for delivering a common supply voltage to the plurality of circuit blocks, the semiconductor integrated circuit comprising:

a shared power supply interconnection for connecting the plurality of circuit blocks and the plurality of internal power supply circuits;

an external pad connected to the shared power supply interconnection; and a plurality of mode registers provided to correspond to the circuit blocks and the internal power supply circuits and store mode set control signals, respectively, wherein each of the plurality of mode registers updates the stored mode set control signal to a value corresponding to a common test input signal when a macro selection input signal indicating to select the corresponding circuit block of the corresponding internal power supply circuit is input, each of the circuit blocks and internal power supply circuits is operated in a mode corresponding to the mode set control signal stored in the corresponding mode register, one of more of the plurality of internal power supply circuits and circuit blocks are selected by the macro selection input signal during the test mode, and voltage trimming is performed on the level of the supply voltage delivered from each of the plurality of internal power supply circuits.

20. A semiconductor integrated circuit including on a single chip a plurality of circuit blocks and a plurality of internal power supply circuits for delivering a common supply voltage to the plurality of circuit blocks, the semiconductor integrated circuit comprising:

a shared power supply interconnection for connecting the plurality of circuit blocks and the plurality of internal power supply circuits;

an external pad connected to the shared power supply interconnection; and a plurality of mode registers provided to correspond to the internal power supply circuits, each of which stores a mode set control signal and a selection signal which indicates whether or not to select the corresponding internal power supply circuit, wherein each of the plurality of internal power supply circuits is operated in a mode corresponding to the mode set control signal stored in the corresponding mode register when the selection signal stored in the corresponding mode register indicates to select the internal power supply circuit, and each of the plurality of mode registers stores, in addition to the selection signal indicating whether or not to select the corresponding internal power supply circuit, a selection signal indicating whether or not to select the other internal power supply circuits than the internal power supply circuit corresponding to the mode register.

* * * * *